United States Patent

Mukai et al.

[15] 3,648,064

[45] Mar. 7, 1972

[54] MULTIPLE SIGNAL LEVEL HIGH-SPEED LOGIC CIRCUIT DEVICE

[72] Inventors: Hisakazu Mukai; Hideaki Kindo; Yoshimasa Sugahara; Akinori Yamagata, all of Tokyo, Japan

[73] Assignee: Nippon Telegraph and Telephone Public Corporation, Tokyo, Japan

[22] Filed: June 30, 1969

[21] Appl. No.: 837,620

[30] Foreign Application Priority Data

July 1, 1968 Japan....................................43/45101
July 5, 1968 Japan....................................43/46469
Sept. 21, 1968 Japan....................................43/68124

[52] U.S. Cl...............................307/213, 307/214, 307/215, 307/218

[51] Int. Cl.................H03k 19/08, H03k 19/34, H03k 19/22

[58] Field of Search..................307/213, 214, 215, 218, 203, 307/207, 209, 211

[56] References Cited

UNITED STATES PATENTS

| | | | |
|---|---|---|---|
| 3,218,483 | 11/1965 | Clapper | 307/215 X |
| 3,229,119 | 1/1966 | Bohn et al. | 307/215 X |
| 3,259,761 | 7/1966 | Narud et al. | 307/215 |
| 3,510,685 | 5/1970 | Watanabe et al. | 307/215 X |
| 3,523,194 | 8/1970 | Sheng | 307/215 X |

*Primary Examiner*—Stanley D. Miller, Jr.
*Attorney*—Watson, Cole, Grindle & Watson

[57] ABSTRACT

A multiple signal level high-speed logic circuit device wherein the logic gates within a block operate under both small- and high-logic signal swings through a direct coupling configuration. The small logic signal swing is supplied from a low-voltage electric source, and the interconnections between the respective blocks are made through voltage-level converting circuits which use PN-junction level shifts.

5 Claims, 6 Drawing Figures

Patented March 7, 1972 3,648,064

4 Sheets-Sheet 1

INVENTORS

Hisakazu Mukai
Hideaki Kondo
Yoshimasa Sugahara
Yukinori Yamagata

BY

Watson, Cole, Grindle & Watson

ATTORNEY

INVENTORS

Hisakazu Mukai
Hidetaki Kindo
Yoshimasa Sugahara
Akinori Yamagata

BY

Watson, Cole, Grindle & Watson
ATTORNEY

INVENTORS
Hisakazu Mukai
Hideaki Kindo
Yoshimasa Sugahara
BY Akinori Yamagata
Watson, Cole, Grindle & Watson
ATTORNEY

Patented March 7, 1972 3,648,064

INVENTOR

Hisakaya Makai
Hideaki Kinda
Yoshimasa Sugahara
BY Akinori Yamagata

Watson, Cole, Grindle & Watson
ATTORNEY

MULTIPLE SIGNAL LEVEL HIGH-SPEED LOGIC CIRCUIT DEVICE

This invention relates to a logic circuit device formed of a plurality of integrated logic network and more particularly to a circuit formation having many unit logic gate circuits packaged at a high density and operating at a very high speed.

An emitter coupled logic (ECL) circuit has been extensively used for a high-speed logic circuit formed of integrated circuits and is a circuit wherein the emitters of a plurality of inverter transistors are commonly connected, input signals are applied to their bases, and a transistor in which a reference voltage is provided to its base, are connected to a common constant-current circuit. A current switch is formed between the above-mentioned inverter transistors and the transistor to which a reference voltage is provided so that a voltage drop at a collector series resistance connected between the collector of both transistors and an electric source forms an output, through an emitter follower transistor of a logic NOR or logic OR. The functions of the emitter follower transistor are to operate in a perfectly nonsaturated condition transistors for a current switch, to make a level shift for matching the output and input logic levels, and as amplifier for feeding a large electric current to the load In this circuit, the transistor operates in a perfectly nonsaturated condition and therefore the operating speed is very high.

However, a disadvantage of this circuit is that the electric power consumption is high, because the electric power consumption in both the emitter follower transistor circuit and the constant-current circuit of the current switch are high. Usually such an ECL circuit is operated with about a volt voltage 5 source and its logic swing is about 0.8 volt.

With the progress of integrated circuit techniques, there has been made a so-called large scale integrated circuit (LSI) in which the number of unit circuits formed on one semiconductor circuit substrate is remarkably increased over previously known techniques. However, it has been impossible to increase the degree of integration by using conventional emitter coupled logic, because its electric power consumption is high.

Further, in the case of increasing the circuit density in a device by mounting many integrated circuits on a ceramic substrate or printed board, the conventional ECL has so high a power consumption that it is very difficult to remove the heat generated in the circuit and therefore the temperature of the device is so high that the reliability of the element is reduced.

On the other hand, in order to operate the logic device at a higher speed, it is necessary to reduce the delay time of the signal propagation the circuit. In general, the higher the operating speed of logic circuits, the larger their electric power consumption, and the above mentioned requirement can not be satisfied by using conventional high-speed logic circuits.

Now, in LSI wherein many circuits are contained in a single chip and are connected with one another to form a functional block, the interconnection paths are so short that the induced noise between the interconnecting lines is very small and the element characteristics, source voltage and temperature of the respective circuits are very uniform. The logic circuit operating under such conditions does not always require as great a noise margin as in the conventional logic circuit. Therefore, it is possible to reduce the power consumption by using a novel logic circuit which operates with a low source voltage and a small logic swing.

However, in making a higher speed logic device of a higher circuit density by using such new logic circuits, the speed is so high that, in some part of the device, the induced noise is large, and because the circuit density is high, the current density is increased. Thus a fluctuation of the source voltage occurs and, as a result, the error of the logic operation increased.

Thus the formation of a high-speed logic device by conventional techniques involves many difficulties.

The present invention provides an economical high-speed logic device wherein the aforementioned difficulties described above are solved and the current producing technique is effectively utilized.

A main object of the present invention is to provide a novel high-speed logic device adapted to use LSI techniques.

Another object of the present invention is to provide a logic device operating level margin by using LSI techniques.

A further object of the present invention is to provide a logic device with very high circuit density by using LSI techniques.

A further object of the present invention is to provide an economical logic device wherein LSI and conventional IC techniques are used and effectively coupled with each other.

In the present invention, the logic circuit block is formed on the same semiconductor chip or the same printed board and comprises low-level logic circuits having a small logic swing operated from a low-voltage electric source. The logic block formed by connecting the separated circuits within the device between many printed boards includes high-level logic circuits having a large logic swing operated from a high source voltage in the same manner as in conventional ECL circuits. Further, a logic level converter is inserted between the low-level logic circuit and high-level logic circuit.

The above-mentioned low-level logic circuit comprises a plurality of low-level unit gates wherein at least one input terminal is provided in at least one base of the first transistors having their emitters connected to a first voltage source through a common resistance or such common circuits a constant-current circuit and an output terminal is provided in at least one collector of the first transistor so that the collector voltage, from a resistance connected to the collector and a second voltage source provides an output signal. In such case, the interconnection between the gages is accomplished by directly connecting the output of a preceding gate to the input of a following gate.

The above-mentioned high-level logic circuit consists of a plurality of high-level logic unit gates which are connected to third and fourth voltage sources wherein the potential difference is larger than that of the first and second electric source. In this high-level logic circuit an inverter transistor in a unit gage is connected to another inverter transistor in another unit gate via at least one PN-junction element for level shift so that the logic swing of the high-level logic circuit may be larger than that of the low-level logic circuit.

One example of the high-level logic unit gate is a so called current switch circuit wherein, in the same manner as in conventional ECL techniques, an input signal is applied to at least one base of a plurality of second transistors connected to the third electric source through a resistance or constant-current circuit common with the emitters, a reference voltage is applied to the other base, the collectors of the transistor to which the reference voltage has been given and the other transistors are connected to the fourth electric source through respective resistances and the voltage drop at both ends of this collector series resistance is taken as an output signal. In connecting these gates, the logic level is shifted by inserting an emitter follower transistor between the input terminal provided in the base of the above-mentioned second transistor a gate and the output terminal provided in the collector. Further, the potential difference between the third and fourth electric sources is larger than the potential difference between the first and second electric sources. In some applications, the first and third or second and fourth electric sources may be common.

In the above-mentioned logic level converting circuits, there are first logic level converting circuit for converting the logic level from the low level logic circuit to the high-level logic circuit and a second logic level converting circuit for converting the logic level from the high-level logic circuit to the low-level logic circuit. Either of them receives a signal of the output logic level of the preceding step as it is or as shifted with a PN-junction element and emits an output conforming to the input logic level in the succeeding step.

For example, in the case where the high-level logic circuit consists of current switch types of gates like the conventional ECL the logic level converting circuit also includes a current switch circuit which is formed of one or more third transistors (in the case of the first logic level converter) or fourth transistors (in the case of the second level converter) having emitters connected to a common constant-current source and in which an input signal is given to at least one base and a reference voltage is given to the other base. An output signal is taken from the collector of these transistors. Particularly, in the first logic level converting circuit, as the current is switched by receiving the output of the low-level logic circuit of a small logic swing, it is necessary to strictly determine the value of the reference voltage in the current switch circuit. In a circuit connection wherein the output of the preceding gate is applied as it is to the base of the third transistor, the value of such reference voltage is determined to be an intermediate value of the logic level of the low-level logic circuit. Further, in the case of a circuit connection wherein the output level of the preceding gate is shifted by a PN-junction element and is applied as an input to the base of the third transistor, it is essential to shift the level of the above mentioned reference voltage by the forward voltage drop of the PN-junction element from the intermediate value of the logic level of the low-level logic circuit.

Figure 1:
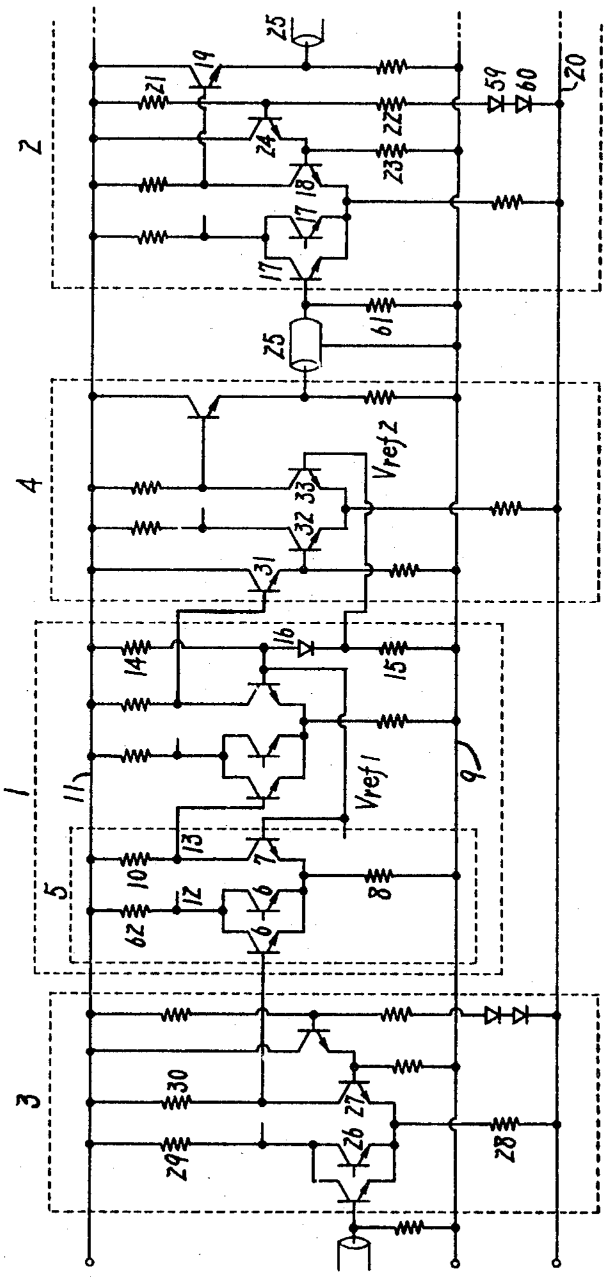
FIGS. 1, 2, 3 and 4 show embodiments of the device according to the present invention.

In FIG. 1, circuit blocks 1, 2, 3 and 4 are respectively a low-level logic circuit, high-level logic circuit, the second logic level converting circuit and the first logic level converting circuit. In the unit gate circuit 5 of the low-level logic circuit 1, the first transistors 6 and 7 form a current switch. That is to say, a reference voltage $V_{ref\ 1}$ is provided to the base of the transistor 7 and an input signal is provided to the base of the transistor 6. The emitters of the first transistors are connected to the first electric source wire 9 through a common resistance 8 and the collectors of the transistors 6 and 7 are connected to the second electric source wire 11 respectively through resistance 62 and 10. Respective output terminals 12 and 13 are provided in the collectors of both transistors. The circuit formed of resistances 14 and 15 and a diode 16 is a circuit for feeding the above-mentioned reference voltage $V_{ref\ 1}$. By selecting the ratio of the resistances 14 and 15, the reference voltage $V_{ref\ 1}$ can be selected to be of an intermediate value of the input logic level applied to the base of the transistor 6.

The unit gage circuit forming the circuit block 2 of the high-level logic circuit in the diagram is exactly the same as a conventional emitter-coupled logic circuit. In the case of connecting the gates formed by the current switches of the second transistors 17 and 18, an emitter follower transistor 19 is used for both level shifting and amplification. In the high-level logic circuit, the emitters of the second transistors are connected to the third electric source 20 through a resistance but the fourth electric source to which the collectors are connected through a resistance is the same as the second electric source 11 in this embodiment. The circuit formed of resistances 21, 22 and 23, transistor 24 and diodes 59 and 60 is a circuit for feeding a reference voltage to the base of the transistor 18 forming a current switch. The signal transmission line 25 is a signal line connecting separated gates. The resistance 61 is added to match the impedance of the signal line.

The circuit block 3 is a second logic level converting circuit and converts a signal level of a large logic swing of the high-level logic circuit to a signal level of a small logic swing of the low-level logic circuit. The circuit type is substantially the same as that of the high-level logic circuit of the circuit block 2. The logic swing of the output is made to be on the same level as the lower-level logic circuit by properly selecting the ratios of the resistances 28 and 29 and of the resistances 28 and 30 of the current switch formed of the fourth transistors 26 and 27. Further, an output signal is taken directly from the collector of the fourth transistors without being passed through the emitter follower transistor and is applied as an input signal to the low-level logic circuit.

The first logic level converting circuit converts 4 a small logic swing of the low-level logic circuit to a large logic swing of the high-level logic circuit. Its circuit type also resembles that of the high-level logic circuit. The features of this circuit are that the output of the low-level logic circuit is shifted in the level with an emitter follower transistor 31 and is fed as an input to the current switch formed of the third transistors 32 and 33 and that the reference voltage $V_{ref\ 2}$ applied to the base of the transistor 33 forming the current switch is of a value obtained by making the same level shift as of the logic level from the reference voltage $V_{ref\ 1}$ of the low-level logic circuit by using the diode 16.

In the low-level logic circuit 1, no level shift by the emitter follower transistor is made between the current switches forming unit gates and therefore, not only the electric power consumption in the circuit of the emitter follower transistor is eliminated but also the electric source voltage can be reduced to be of a very low value (for example, less than 2 volts) and thus it is possible to reduce the power consumption. As no level shift by the emitter follower transistor is made, the logic swing will be about half (400 mv.) that of an ordinary emitter coupled logic (ECL) circuit and the noise margin will be small. However, as this logic circuit is used in a place (for example, within LSI) where the induced noise is low, there will be no problem. Further, as the emitter follower transistor is eliminated, a load is connected directly to the collector of the first transistor but the stray capacity of the interconnection wire is so small between the adjacently arranged gates that its influence is comparatively small. If a logic circuit if formed on the same semiconductor chip, ceramic substrate or printed board and the induced noise is small, it will be possible to use the above-mentioned low-level logic circuit, thereby the power consumption will be remarkably reduced and it will be possible to increase the packing density of the gates.

In the high level logic circuit 2, in the case of connecting the unit gates formed of the current switches, a level shifting emitter follower transistor is inserted between the current switches. Thereby are obtained advantages of a large logic swing (of about 0.8 volt) and the characteristics will be hardly influenced by the stray capacity of the interconnection wire. This circuit is used wherever the interconnection line is so long that the induced noise is large, for example where the interconnection wire bridges printed boards. In case a signal is transmitted through such a long signal line unless a matching resistance 61 is added at the end, the reflection loss will increase. Generally the impedance of the signal line in a printed board or the like is so low that the value of the matching resistance is somewhat small. Therefore, the electric current flowing will be large and the power consumption will be increased. In the present invention, this matching resistance is connected between the first electric source and the signal line so that the voltage applied to both ends of the resistance may be reduced and increase of the power consumption may be prevented.

In the second logic level converting circuit 3, a large logic swing of the high-level logic circuit is received and is converted to a small logic swing for the lower level logic circuit. Therefore, the reference voltage of the current switch is selected to be in the middle of the logic level of the high-level logic circuit. Particularly it is necessary that the reference voltage should also vary in response to the temperature variation of the logic level. The type of the reference voltage feeding circuit varies with the type of the high-level logic circuit.

In the first logic level converting circuit 4, a small logic swing of the low-level logic circuit is received and therefore the manner of determining the value of the reference voltage $V_{ref\ 2}$ of the current switch is particularly important. In the embodiment in FIG. 1, in order to make the logic swing large, the logic level is shifted with the transistor 31 and, there is used the reference voltage $V_{ref\ 2}$ which is also shifted in level from the reference voltage $V_{ref\ 1}$ of the current switch of the lower level logic circuit by using the diode 16. Thereby the accurate operation of the circuit can be guaranteed over a wide temperature range. Also, the output of the first logic level converting circuit is exactly the same as the high-level logic circuit and it is also possible to omit the high-level logic circuit and to connect the output of the first logic level connecting circuit directly to the second logic level converting circuit.

In the embodiment in FIG. 1, in either the lower level logic circuit or the high-level logic circuit, a resistance common to the emitters of the current switches is inserted between these emitters and the electric source wire. However, such resistance inherently operates as a constant-current circuit and can be replaced with another constant-current circuit than a resistance.

Figure 2:
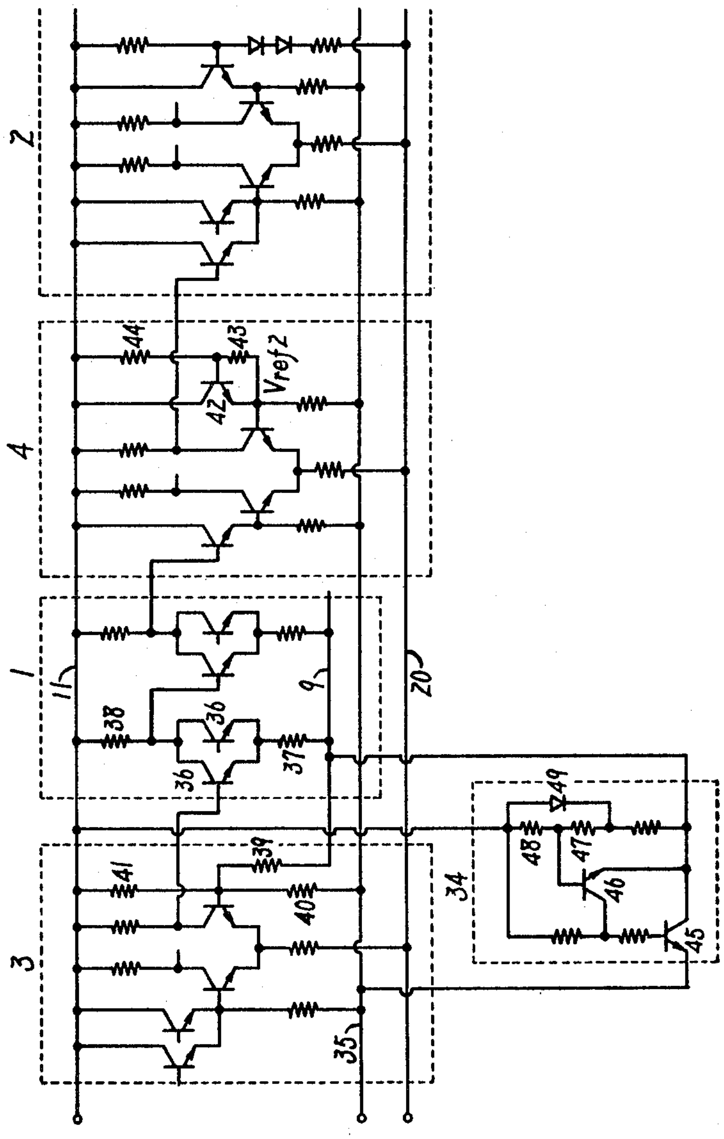

FIG. 2 is of another embodiment of the present invention. The circuit block 1 is a low-level logic circuit. The circuit block 2 is a high-level logic circuit. The circuit block 3 is a second logic level converting circuit. The circuit block 4 is a first logic level converting circuit. The circuit block 34 is a source voltage stabilizer. The source voltage stabilizer is a circuit for generating a stabilized voltage from electric sources 34 and 11 in order to obtain the first electric source 9 and the second electric source 11 of the low-level logic circuit. Therein the temperature variation characteristics of the output voltage, that is, the potential difference between the electric sources 11 and 9 and of the base-to-emitter voltage are similar to each other.

In the low level logic circuit of this embodiment, a unit gate is formed of a first transistor 36 and resistances 37 and 38. The ratio of the resistance 38 to the resistance 37 is selected to be of a value which is somewhat larger than one. The potential difference between the electric sources 11 and 9 is approximately of the sum of the base-emitter forward voltage of the transistor 36 and the logic swing. Here the logic swing is about 0.4 volt which is smaller than the value of the base-emitter forward voltage of the transistor 36 less the output saturation voltage of the transistor. The threshold characteristic of the unit gate circuit is not so critical but, when the logic circuit is assembled of a plurality of unit gates, it will have a binary logic operation as a group of gates. In the connection between the unit gates, the same as in the case of the embodiment in FIG. 1, no level shifting transistor is inserted. Therefore, this low-level logic circuit operates at a high speed with very low electric power.

It is different from the embodiment in FIG. 1 in that, in the high-level logic circuit of the circuit block 2, the unit gate interconnection circuits are formed of current switches, and a level shifting emitter follower transistor is provided on the input side of the current switch.

In the second voltage level converting circuit 3, to the base of one transistor of the current switch is applied a constant reference voltage from the circuit consisting of resistors 39, 40 and 41. As the voltage of the first electric source 9 varies with temperature, the reference voltage also varies with temperature through the function of the circuit block 34 as described below and its variation rate can be determined by the resistance values of the resistors 39, 40 and 41.

In the first logic level converting circuit 4, the reference voltage $V_{ref\,2}$ of the current switch is made with a transistor 42 and a ratio of resistances 43 and 44. In the low level logic circuit, as the source voltage varies with the temperature in proportion to the temperature variation of the base-emitter voltage VBE of the transistors, the logic swing will also vary with the temperature in proportion to the temperature variation of the base-emitter voltage VBE. Therefore, the neutral point of the logic level will also vary with the temperature in proportion to the temperature variation of the base-emitter voltage VBE. In the circuit 4 in FIG. 2, the base potential of the transistor 42 is determined at this neutral point. Further, the reference voltage $V_{ref\,2}$, is obtained by shifting the level with the transistor 42 in response to the level shifting emitter follower transistor provided on the input side of the current switch.

In the source voltage stabilizer shown by the circuit block 34, the transistor 45 is an output transistor and the transistor 46 is a controlling transistor. The output voltage is determined by the ratio of the resistances 47 and 48, the forward voltage drop of the diode 49 and the base-emitter voltage of the transistor and the forward voltage drop of the diode will vary and therefore the output voltage, that is, the potential difference between the electric sources 9 and 11 will vary. This acts to just compensate the variation of the operating point of the transistor with the variation with the temperature of the base-emitter voltage of the transistor 36 in the unit gate of the low level logic circuit 1.

Figure 3:
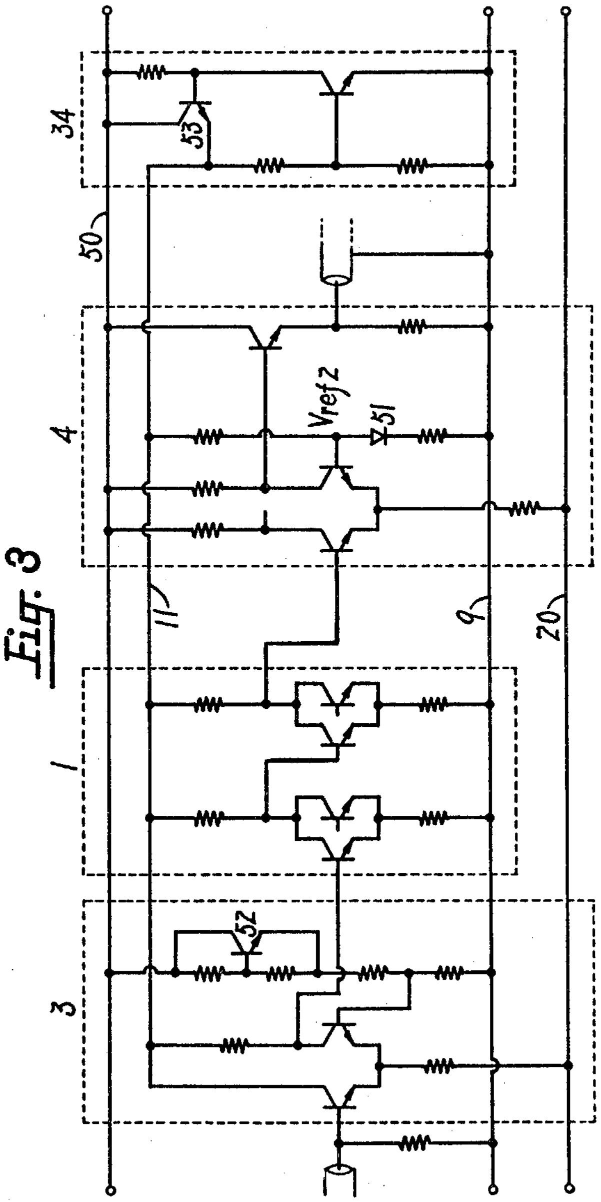

FIG. 3 is another embodiment of the present invention. The electric sources 9 and 11 of the low-level logic circuit 1 are fed through a source voltage stabilizer 34 from electric sources 9 and 50 fed externally. It differs from FIG. 2 in that the potential of the second electric source 11 is stabilized. In this case, the low-level logic circuit output is connected without any level shift by an emitter follower transistor to the first logic level converting circuit 4. The reference voltage $V_{ref\,2}$ of this current switch is so determined as to be intermediate between the binary logic levels of the low-level logic circuits. The diode 51 is set to match the temperature characteristic of the reference voltage $V_{ref}$ to that of the logic level.

In the second logic level converting circuit 3, the collector of the current switch is connected to the second electric source of the low-level logic circuit so that the level may be accurately converted to the low-level logic circuit. The transistor 52 is added to give a proper temperature characteristic to the reference voltage supplied to the current switch.

The circuit block 34 is a source voltage stabilizer in which a load current is provided by emitter follower transistor 53 and the response time of the circuit is short.

Figure 4:
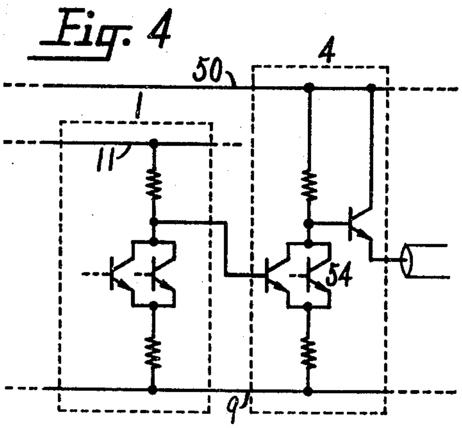

FIG. 4 is another embodiment of the first logic level converting circuit 4 in FIG. 3. In this circuit, no reference voltage is given to the third transistor 54. With same as the unit gate of the low-level logic circuit 1, the logic level converting circuit in FIG. 4 has no such critical threshold characteristic. When the ratio of the resistances connected to the emitter and collector of the transistor 54 is selected to be proper, the logic signal swing from the collector of the transistor 54 will become the same as the logic swing of the high-level logic circuit. FIG. 4 has an advantageous feature in that the circuit is simple.

In the above embodiment, the output of the high level logic circuit is applied to the second logic level converting circuit and the output of the first logic level converting circuit is applied to the high-level logic circuit. However, it is evident that the logic level converting circuit is considered to be also a kind of high-level logic circuit and that the output of the first logic level converting circuit can be applied to the input of the second logic level converting circuit.

In the above explanation, NPN-transistors have been used. However, it is evident that PNP-transistors may also be used.

Figure 5:
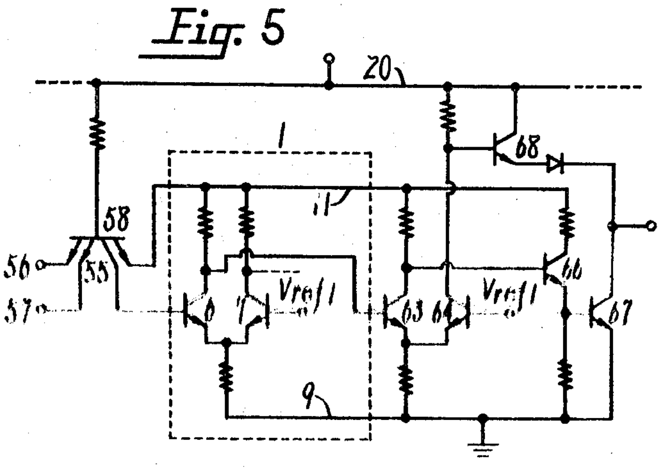
FIGS. 5 and 6 are embodiments showing the connection of a low-level logic circuit and a high-level logic circuit of a transistor transistor logic (TTL) circuit.

FIG. 5 shows an embodiment wherein transistor transistor logic (TTL) or diode transistor logic (DTL) is used and wherein an input AND gate and a grounded emitter inverter transistor circuit are used as unit gates of a high-level logic circuit. In the high-level logic circuit, each unit gate has a level shifting PN-junction element connected between the input AND gate and the grounded emitter transistor so as to shift the threshold voltage of the input to output transfer characteristic approximately to the center of a large logic-signal swing.

In FIG. 5, the second logic level converting circuit consists of input gate transistor 55 which forms an AND gate circuit. 56 and 57 are high-level input terminals. 1 is a low-level logic circuit. 6 and 7 are transistors forming current switches for a unit gate of a low-level logic circuit. A reference potential $V_{ref\,1}$ is provided to the transistor 7. This circuit has a feature of a clamping PN-junction 58 connected to the second electric source wire 11.

That is to say, if there is a "1" of high logic level in the terminal 56, 57 an electric current will be fed to the transistor 6 through the collector of the transistor 55 from the third electric source wire 20 and the base potential of the transistor 6 will rise. When this base potential has become equal to the potential of the electric source wire 11, that is, to the "1" level of the low-level logic circuit, the PN-junction 58 will conduct, the rise of the base potential of the transistor 6 will stop and the transistor 6 will operate on a determined logic level. Further, when there is a low "0" level input at the terminal 56, the above-mentioned transistor 6 will be in a cutoff state.

The first logic level converter circuit consists of current switch which consists of transistor 63 and 64, amplifying transistor 66, output transistor 62 which corresponds to the inverter transistor in the current sink logic and a circuit which includes transistor 68 and supplies charging current to the load capacitance.

Figure 6:
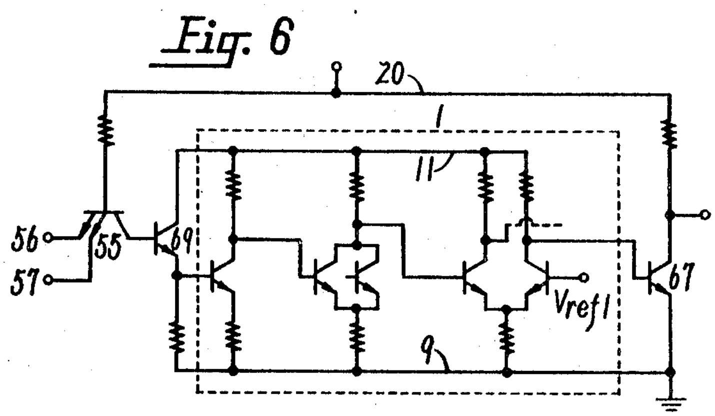

FIG. 6 is another embodiment of logic level converters which convert the logic level between a high-level logic circuit of current sink type and a low-level logic circuit. In the second logic level converter amplifying transistor 69 is inserted after input AND gate transistor 55. The collector junction of transistor 69 also acts as a clamping PN-junction.

As in the above explanation, the present invention is to provide such a circuit device wherein LSI is formed of a low-level logic circuit, and a high-level logic circuit is used where the induced noise and the source voltage fluctuation are large and the logic level conversion between the low-level logic circuit and the high-level logic circuit can be made very smoothly. Also, it is possible to use LSI low level logic circuitry together with conventional integrated logic circuits through the use of the aforedescribed level converters. Thus, the power consumption in the integrated circuit can be reduced, the packing density can be remarkably increased, the operating speed is high and the economy increased.

We claim:

1. A high-speed logic circuit device having multisignal levels, comprising:

A. first, second, third and fourth voltage sources;

B. a number of low-level logic circuits each comprising;

1. at least two unit gates each consisting of a number of first transistors connected in a common emitter configuration, the base of at least one of said number of first transistors receiving a respective input signal, the collector of at least one of said number of first transistors providing an output signal, means for connecting the common emitters of said first transistors to said first voltage source, said collector of said at least said one first transistor is connected to said second voltage source through a first resistance;
2. means for connecting the collectors of said number of first transistors in a first unit gate to the bases of respective first transistors in a second unit gate;

C. a first voltage-level-converting circuit, comprising;

1. a number of second transistors having commonly connected emitters;
2. means for connecting the base of at least one of said second transistors to receive the output signal of said at least one collector in the second unit gate;
3. an output terminal;
4. means for connecting said output terminal to at least one collector of said second transistors;
5. means for connecting said third voltage source to said commonly connected emitters of said second transistors;
6. means for connecting said collector connected to said output terminal to said fourth voltage source through a second resistance;

D. a second voltage-level-converting circuit for receiving the logic level outputs of said first voltage-level-converting circuit; and said second and third voltage sources having a voltage difference greater than the voltage difference between said first and second voltage sources.

2. A high-speed logic circuit device as in claim 1 further comprising a voltage source having an output voltage that varies similarly with temperature as the forward voltage of said first transistors in said low level logic circuits and is used as an electric source for said low-level logic circuit.

3. A high-speed logic circuit device as in claim 1 wherein said first voltage-level-converting circuit further includes at least one PN-junction in said means for connecting said output signal of said low-level logic circuit to the base of at least one of said second transistors, and a second PN-junction connected to the base of another of said second transistors to supply a constant voltage level from the intermediate level of binary logic signals in said low-level logic circuits.

4. A high-speed logic circuit device as in claim 8 further comprising a high-level logic gate connected between said first voltage converting circuit and said second voltage converting circuit, said gate comprising; a number of third transistors, and at least one PN-junction for shifting the signal level between two of said third transistors whereby said high-level logic gate operates with a greater logic swing than said low-level logic gates.

5. A high-speed logic circuit device as in claim 4 wherein said high-level logic gate has an output terminal connected to a transmission line and a third resistance is connected between said first voltage source and said transmission line.

* * * * *